United States Patent [19]

Davidson

[11] Patent Number: 5,618,655
[45] Date of Patent: Apr. 8, 1997

[54] PROCESS OF REDUCING TRACE LEVELS OF METAL IMPURITIES FROM RESIST COMPONENTS

[75] Inventor: James M. Davidson, Corydon, Ind.

[73] Assignee: Olin Corporation, Norwalk, Conn.

[21] Appl. No.: 503,364

[22] Filed: Jul. 17, 1995

[51] Int. Cl.$^6$ ............................................. C08F 6/00
[52] U.S. Cl. .......................... 430/347; 430/169; 528/482; 528/490; 528/491; 528/495; 528/497; 528/499
[58] Field of Search ..................... 528/482, 490, 528/491, 495, 497, 499; 430/192, 169, 347

[56] References Cited

U.S. PATENT DOCUMENTS

| | | | |
|---|---|---|---|
| 2,865,875 | 12/1958 | Hyman et al. | |
| 3,067,172 | 12/1962 | Carlstrom . | |
| 3,432,453 | 3/1969 | Gladney et al. | |
| 4,033,909 | 7/1977 | Papa . | |
| 4,725,523 | 2/1988 | Miura et al. | 430/192 |
| 5,073,622 | 12/1991 | Wojtech et al. | 528/486 |
| 5,075,193 | 12/1991 | Dresely et al. | 430/169 |
| 5,080,997 | 1/1992 | Hioki et al. | 430/168 |
| 5,116,715 | 5/1992 | Roland et al. | 430/190 |
| 5,378,802 | 1/1995 | Honda | 528/480 |

FOREIGN PATENT DOCUMENTS

0251187-A2  1/1988  European Pat. Off. .

*Primary Examiner*—Christopher G. Young
*Attorney, Agent, or Firm*—William A. Simons; Wiggin & Dana

[57] ABSTRACT

A process of removing trace metal impurities from an impure resist component solution comprising the steps of:

(1) forming an impure resist component solution containing trace amounts of dissolved metallic impurities, the resist component solvent selected from the group consisting of ethyl lactate, ethyl 3-ethoxypropionate, methyl 3-methoxypropionate, propylene glycol methyl ethyl acetate, or mixtures thereof;

(2) contacting said impure resist component solution with a mixture of cyclohexane and isopropyl acetate and with an aqueous acidic solution for a sufficient amount of time to form a first two-phase reaction mixture comprising a first aqueous phase containing metallic impurities extracted from said impure resist component solution and a first organic phase containing said resist component solution with a reduced amount of trace metal impurities;

(3) separating said first aqueous phase from said first organic phase;

(4) contacting said first organic phase with a mixture of water and resist component solvent for a sufficient amount of time to form a second two-phase reaction mixture comprising a second aqueous phase containing metallic impurities extracted from said first organic phase and a second organic phase containing said resist component solution with further reduced amount of trace metal impurities;

(5) separating said second aqueous phase from said second organic phase; and (6) removing said cyclohexane and said isopropyl acetate from said second organic phase, thereby forming a pure resist component solution.

8 Claims, No Drawings

PROCESS OF REDUCING TRACE LEVELS OF METAL IMPURITIES FROM RESIST COMPONENTS

BACKGROUND OF THE INVENTION

1. Field of the Invention

The present invention relates to a process for removing trace levels of metallic impurities from a photoresist component (e.g., novolak resin) solution. In particular, the present invention is directed to a process of removing trace levels of metallic impurities from such photoresist component solutions by washing the photoresist component solution with a mixture of cyclohexane and isopropyl acetate and acidic aqueous solution; and then washing the photoresist component with mixtures of water and the original solvent.

2. Brief Description of the Prior Art

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam, and X-ray radiant energy are radiation types commonly used today in microlithographic processes. After this image-wise exposure, the coated substrate is treated with a developer solution to dissolve and remove either the radiation-exposed or the unexposed area of the coated surface of the substrate.

There are two types of photoresist compositions-negative-working and positive-working. When negative-working photoresist compositions are exposed image-wise to radiation, the areas of the resist composition exposed to the radiation become less soluble to a developer solution (e.g., a cross-linking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g., a rearrangement reaction occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, the desired portion of the underlying substrate surface is uncovered.

After this development operation, the now partially unprotected substrate may be treated with a substrate-etchant solution or plasma gases and the like. This etchant solution of plasma gases etch the portion of the substrate where the photoresist coating was removed during development. The areas of the substrate where the photoresist coating still remains are protected and thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase it adhesion to the underlying substrate and its resistance to etching solutions.

Positive-working photoresists are generally prepared by blending a suitable alkali-soluble binder resin with a photoactive compound (PAC) which converts from being insoluble to soluble in an alkaline aqueous developer solution after exposure to a light of energy source. The most common class of PAC's employed today for positive-working resists are napthoquinonediazide (DNQ) esters of a polyhydroxy compound.

Positive-working photoresist compositions are currently favored over negative-working resists because the former generally have better resolution capabilities and pattern transfer characteristics.

The quality of photoresists can be improved by substantially reducing the amount of contaminating metal ions in the photoresists. These metallic impurities include ions of iron, sodium, barium, calcium, magnesium, copper, and manganese as well as other metals. In positive-working resists, these impurities are mainly attributable to the binder resin component in the photoresist. The binder resin in positive-working resists is generally a phenolic formaldehyde novolak resin. Typical novolak resins used today for positive-working resins are made from various mixtures of cresols, xylenols, and trimethylphenols which are condensed with an aldehyde source (e.g., formaldehyde). The contaminating metal ions get into these resins primarily as a result of their preparation process. Moreover, the free phenolic OH groups in novolak resins promote the incorporation of metal ions therein by proton exchange and by complexing on the polar groups. In other words, once metallic ion impurities get into a novolak resin, it is difficult to remove them.

Water washing of impure novolak resin dissolved in an organic solvent results in only a minor purifying effect. Similarly, techniques involving volatization of the metal ions are impracticable.

The prior art is filled with numerous techniques for reducing the amount of metal impurities in photoresist components. Some of these teachings including the following:

1. U.S. Pat. No. 2,865,875, which issued to Hyman et al., on Dec. 23, 1958, is discussed with producing "low ash" phenol-formaldehyde resins and their preparation. Note that the patent teaches that phenol and formaldehyde may be reacted with two different types of alkaline catalysts (i.e., a fixed alkali metal catalyst such as caustic soda or a volatile nitrogen-containing catalyst such as ammonia). The patent states that a drawback to the use of the fixed alkali catalyst is the objectionable presence of the fixed alkali in the final resin. The patent described a prior art method for producing "filtered resins" which involved reacting phenol and formaldehyde with a mixed alkali and then after condensation has occurred, adding a precipitating acid such as phosphoric or oxalic acid. This causes a substantial part of the free alkali in the reaction mixture to be precipitated. That precipitate can then be filtered out. The Hyman et al. patent alleges that this prior art method always leaves behind residual traces of the salt formed which is high enough to adversely affect the quality of the product.

Hyman et al.'s invention instead involved (1) carrying out the phenol-formaldehyde condensation in a conventional manner with a fixed alkali catalyst; (2) then removing that fixed alkali catalyst in whole or in part by use of an cationic ion exchanger; and (3) and if pH of the resin solution goes below 4, adjusting the pH of the resin solution upward to pH 4–8 by addition of further alkali. Suitable cationic ion exchangers mentioned in the patent included Nalcite, Dowex, Amberlite, and Zeo Karb.

2. U.S. Pat. No. 3,067,172, which issued to Carlstrom on Dec. 4, 1972, teaches removing metal from a phenol formaldehyde resole resin by passing a solution of that resin through a column of a cation exchange material which is insoluble in that solution and saturated with ammonium ions in exchanging position.

3. U.S. Pat. No. 3,432,453, which issued to Gladney et al. on Mar. 11, 1969, teaches a process for removing magnesium, barium or strontium ions from an aqueous solution of phenol-formaldehyde resin comprising (1) adding a soluble ammonium salt (e.g., sulfate, phosphate or carbonate) to said aqueous solution in an amount to bring the pH of said solution to about 5.0 to 6.5, the anion of said ammonium salt capable of forming an insoluble salt with said Mg, Ba or Sr ions; and (2) then raising the pH to 7 of said aqueous solution by addition thereto of ammonia.

4. U.S. Pat. No. 4,033,909, which issued to Papa on Jul. 5, 1977 teaches the removal of ionic species from phenolic resoles by treatment thereof with the free acid form of a cation exchange resin and the hydroxyl form of a strongly basic anion exchange resin.

5. U.S. Pat. No. 4,725,523, which issued to Miura et al. on Feb. 16, 1988, teaches the addition of oxalic acid dihydrate to a novolak solution (see Synthesis Example No. 5, in column 4).

6. U.S. Pat. No. 5,073,622, which issued to Wojtech et al. on Dec. 17, 1991 and is assigned to Hoechst AG, claims process for the preparation of novolak resins having a reduced amount of metal ions, comprising the steps of: (1) dissolving a conventional novolak resin in an organic solvent or solvent mixture in a concentration of about 25 to 50% by weight and then (2) contacting the resultant solution at least once with an acidic compound (e.g., formic acid, acetic acid, oxalic acid, malonic acid, glycolic acid, lactic acid, tartaric acid, or citric acid).

7. U.S. Pat. No. 5,075,193, which issued to Dreselz et al. on Dec. 25, 1991, claims the use of microcrystalline cellulose to remove metal impurities from a solution of a naphthaquinonediazide DNQ compound by absorbing the DNQ compound into the microcrystalline cellulose.

8. U.S. Pat. No. 5,080,997, which issued to Hioki et al. on Jan. 14, 1992, claims a process for preparing a positive resist composition, which process comprise the steps of: reacting a quinone diazide sulfonyl halogenide with a phenol compound in a condensation reaction solvent to form a condensation reaction mixture; mixing the condensation reaction mixture with a solution of an alkali-soluble resin in a resist solvent without isolating a quinone diazide sulfonyl ester from the condensation reaction mixture to form a second mixture; evaporating said condensation reaction solvent from the second mixture to form a third mixture; washing the third mixture with water to form a fourth mixture; and evaporating the water from said fourth mixture to prepare said positive resist composition.

9. U.S. Pat. No. 5,116,715, which issued to Roland et al. on May 26, 1992, teaches the treatment of an aqueous solution of the sodium salt of 1,2-naphthaquinonediazide-5-sulfonic acid (5-DNQ) with a cationic ion exchange resin to make a free-acid 5-DNQ compound for use in making a capped novolak. See col. 8, lines 58–64.

10. U.S. Pat. No. 5,378,802, which issued to Honda on Jan. 3, 1995, teaches a method of removing ionic impurities from a resist component, comprising the steps of: (a) dissolving said resist component in a solvent; (b) contacting said resist component solution with a fibrous ion exchange resin for a sufficient amount of time to remove at least a portion of said ionic impurities onto said fibrous ion exchange resin; and (c) separating said fibrous ion exchange resin bearing said ionic impurities from said resist component solution.

11. European Patent Application 0251187-A2, which was published on Jan. 7, 1988, claims a method for purifying novolak resins by (1) dissolving the novolak resin in a solvent having certain water-insolubility characteristics; (2) extracting the resulting solution with an acidic aqueous solution to reduce the metal content of the resin and then subjecting the resulting extracted solution to centrifugal separation.

12. Czechoslovakian Patent No. CS 259,458, which was published on Apr. 14, 1989, teaches that positive photoresist containing an o-naphthoquinone diazide sensitizer and a novolak resin in an organic solvent may be freed of salts and ions by treatment with anion and cation exchangers at 5°–35° C.

When ethyl lactate, ethyl-3-ethoxy propionate, methyl-3-methoxypropionate, or propylene glycol methyl ether acetate or mixtures thereof are used as a resist component solvent, it is difficult to wash the resultant resist component solution with an aqueous acidic solution (e.g., aqueous oxalic acid solution) to extract trace metal impurities because these organic solvents are very water soluble. When they are used in such washing operations, a portion of them (with a portion of the resist component dissolved there) enter the aqueous phase of the two-phase mixture. Thus, separation of the organic phase and the aqueous phase in such cases results in a loss of the resist component and resist component solvent with the later discarded aqueous phase.

Today, the reduction of metallic impurities is critical to the production of advanced photoresist compositions, particularly those using i-line imaging for the production of 32 Mbit and 64 Mbit and larger Mbit semiconductor devices. Specifically, there is now a need to produce photoresist compositions which contain less than 10 parts per billion of each metallic ion impurity. The process of the present invention is an answer to that need.

BRIEF SUMMARY OF THE INVENTION

A process of removing trace metal impurities from an impure resist component solution comprising the steps of:

(1) forming an impure resist component solution containing trace amounts of dissolved metallic impurities, the resist component solvent selected from the group consisting of ethyl lactate, ethyl 3-ethoxypropionate, methyl 3-methoxypropionate, propylene glycol methyl ether acetate, or mixtures thereof;

(2) contacting said impure resist component solution with a mixture of cyclohexane and isopropyl acetate and with an aqueous acidic solution for a sufficient amount of time to form a first two-phase mixture comprising a first aqueous phase containing metallic impurities extracted from said impure resist component solution and a first organic phase containing said resist component solution with a reduced amount of trace metal impurities;

(3) separating said first aqueous phase from said first organic phase;

(4) contacting said first organic phase with a mixture of water and resist component solvent for a sufficient amount of time to form a second two-phase mixture comprising a second aqueous phase containing metallic impurities extracted from said first organic phase and a second organic phase containing said resist component solution with further reduced amount of trace metal impurities;

(5) separating said second aqueous phase from said second organic phase; and (6) removing said cyclohexane and said isopropyl acetate from said second organic phase, thereby forming a purer resist component solution.

DESCRIPTION OF THE PREFERRED EMBODIMENTS

The term "resist component" as used in the present specification and claims includes alkali-soluble resins such as novolak resins and polyvinyl phenol resins, photoactive compound as well as their precursors, and additives (e.g., speed enhancers, dyes, and the like) conventionally employed in photoresist compositions. This term also includes precursor compounds for making such components. One example of such precursor compounds would be backbone compounds for making photoactive compounds as well as the precursor photoactive ester compounds (e.g., naphthaquinonediazide sulfonyl chlorides). The preferred class of resist components to be treated by the present invention is novolak resins because they generally contain a majority amount of the trace metal impurities in the resist.

The term "novolak resin" as used herein refers to any novolak resin which will dissolve completely in an alkaline developing solution conventionally used with positive-working photoresist composition. Suitable novolak resins include phenol-formaldehyde, novolak resins, cresol-formaldehyde novolak resins, xylenol-formaldehyde novolak resins, cresol-xylenol-formaldehyde novolak resins, preferably having a molecular weight of about 500 to about 40,000, and more preferably from about 800 to 20,000. These novolak resins are preferably prepared by the addition-condensation polymerization of a phenolic monomer or monomers (e.g., phenol, cresols, xylenols, or mixtures of such monomers) with an aldehyde source such as formaldehyde and are characterized by being light-stable, water-insoluble, alkali-soluble, and film-forming. One preferred class of novolak resins is formed by the addition-condensation polymerization between a mixture of m- and p-cresols with formaldehyde having a molecular weight of about 1,000 to about 10,000. Illustrative preparations of novolak resins are disclosed in U.S. Pat. Nos. 4,377,631; 4,529,682; and 4,587,196, all of which issued to Medhat Toukhy and are incorporated herein by reference in their entireties.

Other preferred novolak resins are illustrated in U.S. Pat. No. 5,322,757 and 5,237,037. Their disclosures are also incorporated herein by reference in their entireties.

The term "photoactive compounds" as employed in the present specification and claims may include any conventional photoactive compound commonly used in photoresist composition. Quinonediazide compounds are one preferred class of photoactive compounds. Naphthaquinonediazide compounds are preferred class of species in that generic class. As mentioned above, photoactive compound precursors may be treated according to the present invention. One photoactive compound precursor which has been treated according to this method is 2,6-bis(2,3,4-trihydroxyphenyl-)methylene-4-methyl phenol (also known as 7-PyOL) which is described in Example 3 of U.S. Pat. No. 4,992,356.

Photoresist additives may be treated according to the present invention. Such additives may include speed enhancers, dyes, and the like. One preferred speed enhancer is 1-[(1'-methyl-1'-(4'-hydroxyphenyl)ethyl)]4-[1',1'-bis-(4-hydroxyphenyl)ethyl]benzene (also known as TRISP-PA).

The term "impure resist component solution" as used in the present specification and claims refers to solutions containing at least one trace metal impurity in an undesirable amount, preferably, more than 50 parts per billion (ppb) by weight.

The term "purer resist component solution" as used in the present specification and claims refers to solutions containing at least one trace metal impurity in an amount of less than half of the amount originally present in the impure resist component solution, preferably less than 30 parts per billion (ppb) by weight for each metal impurity.

In the first step of the present process, the impure resist component solution is formed by dissolving the resist component in a selected solvent, or selected solvent mixture to facilitate the later contacting of the resist component with the mixture of cyclohexane and isopropyl acetate and with the aqueous acidic solution. Examples of suitable dissolving solvents include methyl-3-methoxypropionate (MMP), ethyl lactate (EL), ethyl-3-ethoxy propionate (EEP), propylene glycol methyl ether acetate (PGMEA), or mixtures thereof and the like. One preferred solvent is a mixture of ethyl lactate and ethyl-3-ethoxy propionate wherein the weight ratio of ethyl lactate to ethyl-3-ethoxy propionate is from about 30:70 to about 80:20.

The solids contents of the resultant impure resist component solution is not critical. Preferably, the amount of solvent or solvents may be from about 50% to about 500%, or higher, by weight; more preferably from about 75% to about 400% by weight; based on the resist component weight.

While it is preferred to use a single resist component as the material being treated by the method of the present process, it is contemplated within the scope of the present invention that combinations of resist components may be treated. For example, it may be desirable to treat a complete positive-working photoresist formulation (e.g., a combination of a novolak resin or resins, a photoactive compound such as quinonediazide sensitizer, and solvent or solvents as well as conventional optional minor ingredients such as dyes, speed enhancers, surfactants, and the like) according to the method of the present invention.

The impurities in the resist component solution may be in the form of monovalent metal cations such as alkali metals (e.g., $Na^+$ and $K^+$) as well as divalent or trivalent cations (e.g., $Ca^{+2}$, $Fe^{+2}$, $Fe^{+3}$, $Cr^{+3}$, or $Zn^{+2}$). Such metal impurities may also be in the form of colloidal particles such as insoluble colloidal iron hydroxides and oxides. Such metal impurities may come from the chemical precursors for the resist component (e.g., for novolak resins these may be phenolic monomers and aldehyde sources) as well as in the solvent used to make the solution. These impurities may also come from the catalysts used to make the resist components or from the equipment used for their synthesis or storage. Generally, the amount of metal impurities in a resist component such as a novolak resin prior to the present inventive process is the range from 50 ppb–5,000 ppb, or greater, by weight for metals such as sodium and iron. Sodium impurities are generally in the form of monovalent ions ($Na^+$). The iron impurities are in the form of divalent and trivalent species ($Fe^{+2}$ and $Fe^3$) as well as insoluble colloidal iron species (e.g., iron hydroxides and oxides). The resist component impurities may also include anionic impurities such as halides (e.g., $Cl^-$, $F^-$, $Br^-$).

The impure resist component solutions may be made in any conventional method of mixing a resist component with a solvent. Generally, it is preferred that the resist component is added to a sufficient amount of solvent so that the resist component is dissolved in the solvent. This step may be facilitated by agitation or other conventional mixing means.

The next step in the process of the present invention is contacting the resist component solution with a mixture of cyclohexane and isopropyl acetate.

Cyclohexane and isopropyl acetate are employed in the present process because these solvents each have minimal water solubility, be soluble in the resist component solution, have low density (so the resulting resist component solution would have a density less than water), and have a relatively low boiling point (so it would be easy to separate from EL/EEP or the other selected resist component solvents). Cyclohexane alone is soluble in resist component/EL/EEP solutions, but comes out of solution when water is added to the mixture. Isopropyl acetate alone is also soluble in the impure resist component solution and does allow some separation when the solution is mixed with water; but the separation is poor. Unexpectedly, a combination of cyclohexane and isopropyl acetate give good separation with the water layer on the bottom.

The relative proportions of cyclohexane and isopropyl acetate used in this invention may vary from about 80:20 to about 20:80 parts by weight cyclohexane to parts by weight isopropyl acetate.

The impure resist component solution is also contacted with an acidic aqueous solution that extracts at least a portion of the metallic impurities out of the impure resist component solutions.

The acids employed in the aqueous acid solution may be any suitable inorganic or organic acid. Particularly preferred as acids with complexing properties. Preferable inorganic acids include mineral acids such as hydrochloric acid, sulfuric acid, or phosphoric acid. Preferable organic acids are those soluble in water and include low molecular weight carboxylic acids such as formic acid, acetic acid, oxalic acid, malonic acid, glycolic acid, lactic acid, tartaric acid, and citric acid. Oxalic acid is particularly preferred.

Another particularly preferable class of acidic extracting compounds include acidic chelating agents such as nitrilotriacetic acid, ethylene-dinitrilo-tetraacetic acid, 1,2-cyclohexylene-dinitrilo-tetraacetic acid, diethylene-triamine-pentaacetic acid, and 3,6-dioxaocta-methylenedinitrilotetraacetic acid. Additional acidic extracting agents for metal ions include acidic esters of phosphoric acid, phosphonic acid, and phosphenic acid.

The amount of acid in the aqueous solution will depend upon the type of acid employed, the amount of extractable metals present in the resist component, and other factors. If oxalic acid in the acid employed, the preferred amount of oxalic acid in the aqueous solution may be from about 0.05% to about 10%; more preferably, about 0.5% to 5% by weight of that solution. If HCl is employed, the preferred amount of HCl may range from about 0.01% to bout 2%; more preferably, from about 0.1% to about 1% by weight. If EDTA is employed, the preferred amount of EDTA in the aqueous solution may range from about 200–800 parts per million parts of aqueous solution.

The relative amounts of the impure resist component solvent to the total amount of cyclohexane and isopropyl acetate may preferably range from about 10:1 to 1:10 weight ratio. More preferably, weight ratios from 3:1 to 1:3 may be used.

Preferably, the relative amounts of first organic phase (i.e., total amount of impure resist component solution plus the amount of cyclohexane and isopropyl acetate) and the first aqueous phase (i.e., aqueous acidic solution) may range from about 95:5 to about 50:50 by weight first organic phase to first aqueous phase.

The cyclohexane/isopropyl acetate and aqueous acid solution contacting may be effected in any form of liquid-liquid contacting. Contacting is preferably obtained in a single-stage or multi-stage cross-flow or counter current treatment.

This contacting or washing step may be carried out in any suitable apparatus, including the reactor in which the resist component was formed. Generally, the cyclohexane, isopropyl acetate, and aqueous acidic solution are added to the resist component solution and the resulting mixture is agitated for a sufficient amount of time to obtain a thorough mixing of these liquids (e.g., from about 15 to 120 minutes). The mixture is then allowed to sit for a sufficient time (e.g., for about 15 to 120 minutes) to form a two-phase mixture with the organic solvent layer on top and the water layer on bottom.

Next, the first aqueous phase is separated from the first organic phase. This is preferably accomplished by draining the heavier aqueous phase from the bottom of the vessel containing the overall liquid mixture.

After this separation, the separated first organic phase (i.e., containing the cyclohexane and isopropyl acetate as well as the resist component solution with a reduced amount of trace metal impurities) is contacted with a mixture of water and the resist component solvent. This forms a new or second two-phase mixture containing a organic phase and an aqueous phase.

The amount of replacement resist component solvent in the water/resist component solvent mixture should be sufficient to replace the replacement solvent (e.g., ethyl lactate) extracted into the first aqueous phase (i.e., to reestablish the proper dissolving solvent concentration in the separated first organic phase).

The preferable relative amounts of separated organic phase to the water/resist component solvent phase is from about 95:5 to about 70:30. The preferred relative amounts of water to replacement resist component solvent may range from about 10:1 to about 1:10 by weight.

The preferred contacting time for the separated first organic phase with the water/replacement resist component solvent mixture is from about 15 minutes to about 120 minutes.

Then, the second aqueous phase is separated from this second organic phase. Again, this is preferably accomplished by simply draining the aqueous phase from the bottom of the vessel containing the total liquid mixture.

Finally, the cyclohexane and isopropyl acetate are separated from the resist component. This is preferably carried out by a conventional solvent stripping operation. After the separation out of the cyclohexane and isopropyl acetate, the resist component is left in a remaining amount of the resist component solvent or solvents.

The preferred stripping operation is generally carried out under vacuum at a temperature less than 100° C. Alternatively, the cyclohexane and isopropyl acetate may be stripped using thin film evaporation and other conventional solvent stripping techniques.

Preferably, in the case of a novolak resin, it is desirable to strip the cyclohexane/isopropyl acetate to leave a purified resist component solution having about 38–43% by weight solids content and then add more resist component solvent to form a 25–36% by weight solids content.

Through the utilization of the present process, the metal ion content is reduced by a major portion (i.e., 50% or more by weight) for at least one metal impurity and preferably by two to three decimal places for all metal impurities and, as a result, materials can be prepared which meet the stringent requirements in microelectronics.

Accordingly, purer resist component solutions such as novolak resin solutions can be prepared by the present process, which have an amount of sodium ions and iron ions as indicator metal cations under about 20 ppb and under about 20 ppb, respectively. Preferably, the novolak resins have an amount of sodium ions and iron ions under about 10 ppb and under about 10 ppb, respectively. Particularly preferably, the amounts of sodium ions and iron ions are under about 0.2 ppb and 1 ppb, respectively.

The present invention is further described in detail by means of the following Examples and Comparisons. All parts and percentages are by weight and all temperatures are degrees Celsius unless explicitly stated otherwise.

Novolak Solution A

A novolak resin was formed by reacting a mixture of m-cresol and p-cresol with formaldehyde in the presence of oxalic acid catalyst. A dissolving solvent mixture made up of 70% by weight ethyl lactate (EL) and 30% by weight ethyl-3-ethoxypropionate (EEP) was added to the molten novolak at the end of the reaction. The resulting novolak resin was removed from the reactor as a 35% by weight solution in the EL/EEP solvent mixture. This novolak solution was contaminated with sodium ion. The level of sodium in this unwashed novolak solution was 4,527 parts per billion parts (ppb) by weight.

Example 1

Novolak solution A (100 g) as formed above, isopropyl acetate (40 g) and cyclohexane (60 g) were charged into a 1,000 ml separatory funnel. The three components were shook and one phase was formed.

An aqueous 7% by weight oxalic acid solution (11.4 g solution) and deionized water (28.6 g) were then added to the separatory funnel, and the funnel was shook to mix. After setting about 45 minutes, a clear, aqueous bottom layer (42.3 g) was removed from the funnel.

More deionized water (40 g) and ethyl lactate (10 g) were added to the funnel. The ethyl lactate was added to replace the ethyl lactate portion that dissolves in the first aqueous phase. Then the funnel was shook to thoroughly contact the various liquids together. After setting about 30 minutes, a clear, aqueous bottom layer (47.6 g) was removed from the funnel.

More deionized water (40 g) and ethyl lactate (10 g) were again added to the funnel and the funnel was shook to mix. After setting about 30 minutes, a clear, aqueous bottom layer (49.2 g) was removed from the funnel.

More ethyl lactate (30 g) was added to the funnel. The ethyl lactate was added here to facilitate removal of the isopropyl acetate and cyclohexane from the washed mixture. After the ethyl lactate addition, the mixture was then put into a rotary vacuum flask. The mixture was stripped under vacuum until 88 g of a washed novolak solution remained in the flask.

This washed novolak solution was analyzed for trace metals. The amount of sodium in the washed novolak was less than 100 ppb (this was the limit of detection for the method of analysis employed).

The washed novolak solution was analyzed for percent solids and the EL/EEP ratio. Sufficient amounts of EL and EEP were then added to adjust the novolak solution to the original 35% by weight solution in 70% EL/30% EEP by weight.

Novolak Solution B

A novolak solution similar to Novolak A was prepared except that this solution was contaminated with both sodium and potassium. The amounts of sodium and potassium in this unwashed Novolak Solution B were analyzed to be 1,277 and 97,000 parts per billion (ppb) parts by weight, respectively.

Example 2

Novolak Solution B was treated according to the same procedure as set forth in Example 1. The levels of sodium and potassium were analyzed and were found to be lowered to less than 100 ppb sodium and 275 ppb potassium.

Novolak Solution C

A novolak resin was formed by reacting a mixture of m-cresol and p-cresol with formaldehyde in the presence of oxalic acid in methyl 3-methoxypropionate (MMP) solvent. The resulting novolak resin was removed from the reactor as a 35% by weight solution in the MMP solution. This unwashed novolak solution had high trace metal values (e.g., chromium 86 ppb; iron 1,036 ppb).

Example 3

Novolak Solution C was treated according to the same procedure as set forth in Example 1. The levels of all trace metals analyzed after this washing procedure were below the detection limit except chromium which was lowered to 24 ppb.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A process of removing trace metal impurities from an impure resist component solution comprising the steps of:

(1) forming an impure resist component solution containing trace amounts of dissolved metallic impurities, the resist component solvent selected from the group consisting of ethyl lactate, ethyl 3-ethoxypropionate, methyl 3-methoxypropionate, propylene glycol methyl ethyl acetate, and mixtures thereof;

(2) contacting said impure resist component solution with a mixture of cyclohexane and isopropyl acetate and with an aqueous acidic solution for a sufficient amount of time to form a first two-phase reaction mixture comprising a first aqueous phase containing metallic impurities extracted from said impure resist component solution and a first organic phase containing said resist component solution with a reduced amount of trace metal impurities, wherein the ratio of cyclohexane:isopropyl acetate is from about 80:20 to about 20:80 parts by weight;

(3) separating said first aqueous phase from said first organic phase;

(4) contacting said first organic phase with a mixture of water and the resist component solvent as defined in step (1) for a sufficient amount of time to form a second two-phase reaction mixture comprising a second aqueous phase containing metallic impurities extracted from said first organic phase and a second organic phase containing said resist component solution with further reduced amount of trace metal impurities;

(5) separating said second aqueous phase from said second organic phase; and (6) removing said cyclohexane and said isopropyl acetate from said second organic phase, thereby forming a purer resist component solution.

2. The process of claim 1 wherein said resist component is a novolak resin.

3. The process of claim 1 wherein said resist component solvent is a mixture of ethyl lactate and ethyl-3-ethoxypropionate.

4. The process of claim 1 wherein said impure resist component solution contains at least one trace metal impurity in an amount of more than 50 parts per billion (ppb) by weight.

5. The process of claim 1 wherein the amount of each trace metal impurity in said purer resist component solution is less than 30 parts per billion (ppb) by weight.

6. The process of claim 1 wherein the acid in said aqueous acid solution is oxalic acid.

7. The process of claim 1 wherein the ratio of the impure resist component solvent to total amount of cyclohexane and isopropyl acetate is from about 10:1 to about 1:10.

8. The process of claim 1 wherein the ratio of first organic phase to first aqueous phase is from about 95:5 to about 50:50.

* * * * *